US010108758B2

(12) United States Patent
Gonsalves et al.

(10) Patent No.: US 10,108,758 B2
(45) Date of Patent: Oct. 23, 2018

(54) VIRTUAL MOBILE MANAGEMENT FOR DEVICE SIMULATION

(71) Applicant: AETHERPAL INC., South Plainfield, NJ (US)

(72) Inventors: Deepak Gonsalves, Bridgewater, NJ (US); Pooja Chengappa, Edison, NJ (US); Ramesh Parmar, Scotch Plains, NJ (US); Subramanyam Ayyalasomayajula, Kendall Park, NJ (US); Mahadevan Viswanathan, Summit, NJ (US); Byung Joon Oh, Piscataway, NJ (US)

(73) Assignee: AetherPal Inc., South Plainfield, NJ (US)

(*) Notice: Subject to any disclaimer, the term of this patent is extended or adjusted under 35 U.S.C. 154(b) by 766 days.

(21) Appl. No.: 14/075,377

(22) Filed: Nov. 8, 2013

(65) Prior Publication Data

US 2014/0136667 A1    May 15, 2014

Related U.S. Application Data

(60) Provisional application No. 61/725,747, filed on Nov. 13, 2012.

(51) Int. Cl.
*G06F 15/177* (2006.01)
*G06F 15/173* (2006.01)
(Continued)

(52) U.S. Cl.
CPC ...... *G06F 17/5009* (2013.01); *G06F 11/3664* (2013.01); *H04L 41/085* (2013.01);
(Continued)

(58) Field of Classification Search
CPC . H04L 41/0806; H04L 41/145; H04L 41/085; G06F 17/5009
(Continued)

(56) References Cited

U.S. PATENT DOCUMENTS 6,779,134 B1    8/2004  Laviolette et al.
8,244,806 B2 *  8/2012  Arthur ............... G06F 11/3664
                                                709/204

(Continued)

FOREIGN PATENT DOCUMENTS

EP          1818812 A1    8/2007
WO      2012016013 A2    2/2012

OTHER PUBLICATIONS

International Search Report and Written Opinion for PCT/US2013/069260 dated Feb. 25, 2014, 11 pp.

*Primary Examiner* — Ario Etienne
*Assistant Examiner* — Sahera Halim
(74) *Attorney, Agent, or Firm* — Volpe and Koenig, P.C.

(57) ABSTRACT

Described herein is a method and system that provides access to numerous connected devices in a device bank and allows remote interaction and control of aspects of the connected devices using a remote management system. In an embodiment, the method comprises the configuring of one or more connected devices in the device bank to mimic an end user's connected device configuration and environment in order to resolve an issue with the end user's connected device. In other embodiments, the connected devices in the device bank can be used by end users such as developers to test and diagnose new applications and by remote support technicians to train themselves on connected devices.

18 Claims, 11 Drawing Sheets

(51) Int. Cl.
*G06F 17/50* (2006.01)
*H04L 12/24* (2006.01)
*G06F 11/36* (2006.01)
*H04L 12/26* (2006.01)

(52) U.S. Cl.
CPC ........ H04L 41/0806 (2013.01); H04L 41/145 (2013.01); *H04L 43/10* (2013.01); *H04L 43/50* (2013.01)

(58) Field of Classification Search
USPC .......................................................... 709/221
See application file for complete search history.

(56) References Cited

U.S. PATENT DOCUMENTS

| | | | |
|---|---|---|---|
| 2009/0007074 A1 | 1/2009 | Campion et al. | |
| 2010/0030357 A1* | 2/2010 | Tilove | G06Q 10/06 700/100 |
| 2011/0145322 A1* | 6/2011 | Landry | H04L 41/0816 709/203 |

* cited by examiner

VIRTUAL MOBILE MANAGEMENT FOR DEVICE SIMULATION

TECHNICAL FIELD

This application is related to connected devices and in particular to an application of virtual mobile management technology for connected devices which hosts an array of connected devices in a central location offering the capability for technicians to remotely connect and simulate or reproduce connected device issues from the end user.

BACKGROUND

As mobile devices become increasingly popular, new connected devices like smart phones, tablets, personal PDAs, televisions and so on are released into the market regularly. Every connected device, such as a smartphone and tablet is different. They have many different properties including screen size, keyboards, operating systems and internal layout. This creates a need for technicians from various fields like customer support, device application development and testing to have a full understanding of all the connected device features and functionality. This also creates a need for technicians to have hands on experience with the connected devices and the ability to access and use these connected devices at any time. Providing each technician with almost every connected device on the market becomes a very expensive and almost impossible task.

SUMMARY

Described herein is a method and system that provides access to numerous connected devices in a device bank and allows remote interaction and control of aspects of the connected devices using a remote management system. In an embodiment, the method comprises the configuring of one or more connected devices in the device bank to mimic an end user's connected device configuration and environment in order to resolve an issue with the end user's connected device. In other embodiments, the connected devices in the device bank can be used by developers to test and diagnose new applications and by remote support technicians' to train themselves on connected devices.

The system and method provides the ability to use a unified platform to connect to multiple connected devices nearly simultaneously without the need to buy and maintain the connected devices, the ability to test the functionality, usability and performance of almost every application within the connected device and the ability to connect to devices in a manner that is agnostic to operating systems, operating system versions and device manufacturers.

The system and method provides an improved method for recreating the entire troubleshooting session that includes the key taps or key press events and screen display from the connected devices of the device bank.

The system and method provides the ability to replicate frequent issues faced on connected devices by the remote support technician.

The system and method creates an environment wherein the development teams from various remote locations can connect to connected devices on different networks and software platforms that might not be available locally; through a single device bank system.

The system and method provides a comprehensive infrastructure to software programmers that integrates their development environments with remote connected devices. This integration enables the developers to publish and test their applications on remote connected devices. It also provides access to a remote debugging bridge which enables efficient debugging of their applications when using this infrastructure. The system reduces the configurations necessary to piece together multiple development utilities, instead providing the same set of capabilities as a cohesive unit, thus reducing the setup time and increasing developer productivity. Tighter integration of all development tasks has the potential to improve overall productivity and reduce the associated costs.

BRIEF DESCRIPTION OF THE DRAWINGS

A more detailed understanding may be had from the following description taken in conjunction with the accompanying drawings wherein are set forth, by way of illustration and example, certain embodiments. The drawings constitute a part of this specification and include embodiments and illustrate various objects and features thereof.

DETAILED DESCRIPTION

Figure 1:
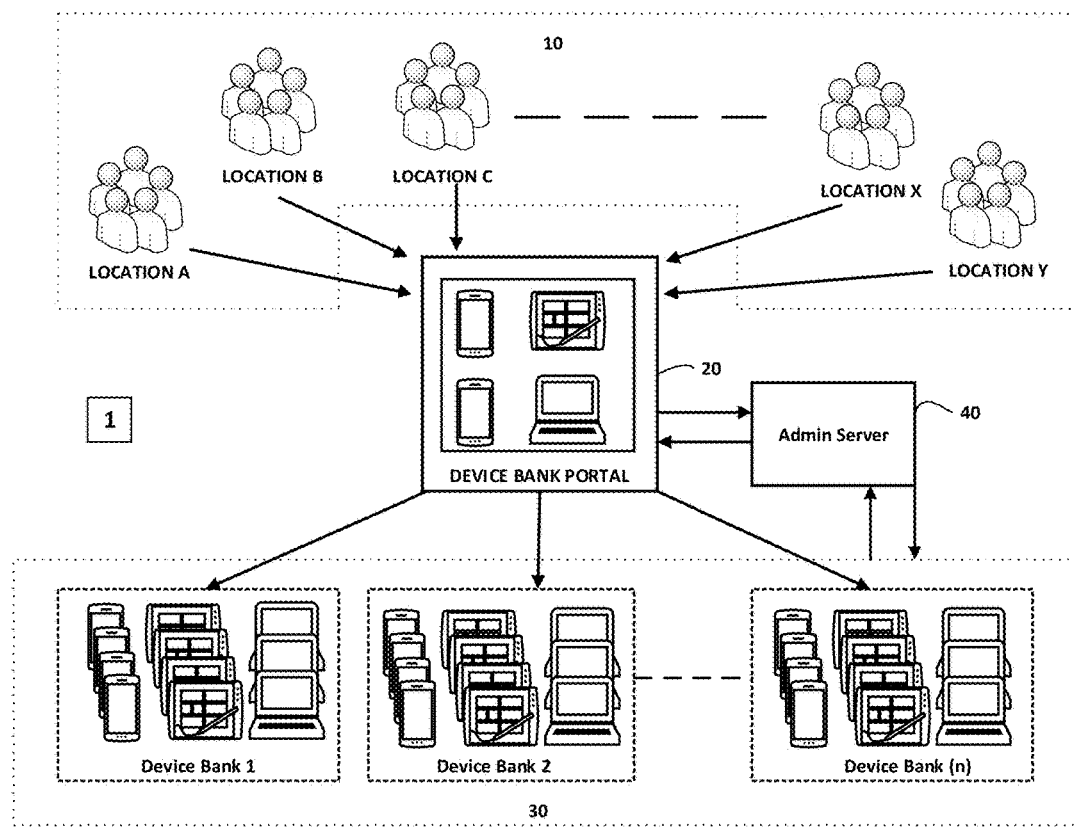
FIG. 1 shows an example system and architecture of a device bank system or a remote management system for device simulation in accordance with some embodiments.

It is to be understood that the figures and descriptions of embodiments have been simplified to illustrate elements that are relevant for a clear understanding, while eliminating, for the purpose of clarity, many other elements. Those of ordinary skill in the art may recognize that other elements and/or steps are desirable and/or required in implementing the embodiments. However, because such elements and steps are well known in the art, and because they do not facilitate a better understanding of the embodiments, a discussion of such elements and steps is not provided herein.

Described herein is a system and method wherein remote support technicians can remotely connect to an array of devices and reproduce events to trace problems encountered by the user on a connected device. The term connected device may refer to, but is not limited to, mobile devices, smartphones, PDAs, smart televisions, tablets, set-top boxes, and the like. The system and method also provides the remote support technicians with an opportunity to reproduce the characteristics and features of a real device in a virtual environment. It replicates the external factors and conditions with which a device interacts, enabling the technician, developer or similarly situated person to feel like they are working with an actual connected device in hand. Scenarios and events can be replicated with sufficient reality to ensure that technicians, developers or similarly situated people get hands on training with the latest devices.

The system and method also provides remote development teams with a cost effective method to access and test on upcoming connected devices as well as old legacy devices and recreate the network environment. The device bank platform also provides development teams with the ability to publish their application to the connected device for debugging and troubleshooting. This feature enables a seamless integration with existing development environments, thus providing development teams with debugging tools available for a given operating system platform.

The system and method provides an efficient method for development, training and troubleshooting by recreating the end user's mobile communication device configuration and environment. The device bank system for connected devices aggregates all registered devices from various geographical locations into a unified system that offers the capability to remotely connect and simulate or reproduce a given connected device.

The system and method can be utilized to remotely access and control connected devices of various make, model, operating system versions and software and hardware versions on demand, replicate issues found by the remote support technicians and find a resolution and test it before making modifications on the end user's connected device. The resolution steps can be communicated either verbally to the end user or by use of remote control technology to remotely access the end user's connected device and apply the resolution steps. Additionally, there might be a prerequisite to train or educate the remote support technicians on certain features of the remote control system and therefore it would be best to have an emulated session to be able to show for training and evaluation purposes.

In general, the subject application uses a simulator and device bank in conjunction with the remote control system that allows a remote support technician to simulate a connected device and helps in the troubleshooting process. A remote support technician benefits by having the ability to simulate an entire event and verify operations in real-time at all stages. The ability to duplicate activity on a user's connected device allows the support personnel to nearly simultaneously pinpoint the source of the user's problem and provide proper instructions to the user. The task of establishing the remote session with the connected device of device bank system can provide quick, real-time solution to the end user.

The subject application is just not limited to troubleshooting the connected device but can be used by remote technicians to practice and train themselves on the operations and functionality of new connected devices from the device bank facility in advance. Newer connected device models can be augmented into the device bank array quickly and easily. Existing connected devices can be easily upgraded to newer software in one central location. This method removes the challenges of creating custom simulators for individual device models which are expensive to maintain and upgrade.

The systems and methods for simulating the end user's connected device problems or issues using remote support system comprises the configuring of one or more set of connected devices to mimic an end user's connected device configuration in order to troubleshoot; transmitting the media stream over a network based on the configuration of the communication component; receiving the media stream over the network; and mimicking the end user's wireless environment.

FIG. 1 shows an example system and architecture of a device bank system 1 or a remote management system for device simulation in accordance with some embodiments. The device bank system 1 comprises of one or more groups of remote users 10 residing in various remote locations A . . . Y, for example, a device bank portal 20, one or more device banks 30 and an administrator server 40. The remote users 10 connect to the device bank portal 20 over the Internet via, for example, a wired link, a wireless link or some combination thereof. The device bank portal 20 presents the remote users 10 with a view of all the connected device in the device bank 30 which are currently available for remote connection. The remote users 10 can choose the desired connected device from the list of available connected devices and send a request for remote connection with the connected device. The request is processed by the device bank portal 20 and is forwarded to the administration server 40. The administration server 40 then locates the appropriate connected device from the device bank 30 and initiates a remote connection through Wi-Fi, Radio (Mobile data connection) or over a tethered link, for example.

The remote users 10 comprises, but is not limited to, of the following set of people: mobile software programmers, technical support technicians, technical support trainers, mobile application testers and so on. These remote users 10 might be located in different geographic locations and are still able to access the remote connected devices and network environment through the device bank system 1.

The device bank portal 20 might be a webpage or an application that can be downloaded and installed on the remote user's computer in order to view all the connected devices that are currently provisioned and enrolled in the device bank system 1 and initiate a remote connection with the necessary connected device. The device bank portal 20 also allows the remote users 10 to view device specifications, device capabilities and tutorials related to the connected device without having to initiate a remote connection with the connected device. This helps in saving time and effort researching and trying to find specific information about upcoming connected devices and legacy devices that might not readily available.

The device bank 30 comprises of a multitude of connected devices that are provisioned and enrolled into the admin server. The device bank 30 includes, but is not limited to, the following types of connected devices: smart phones, PDAs, tablets, laptops, personal computers, televisions and so on. The smart phones include, but are not limited to, android, iOS®, Symbian®, Blackberry®, Windows Mobile and so on. The mode of connection used to connect to the connected device in the device bank could be Wi-Fi, cellular, Mobile data (Radio) or tethered connection (via, for example, universal serial (USB) or other like connection technology including wireless technology).

Figure 2:
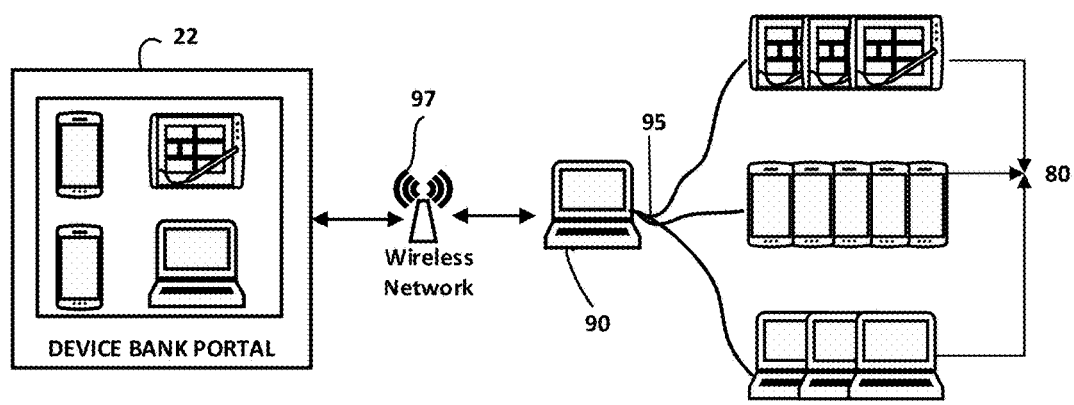
FIG. 2 shows an example of connected devices connected over a tethered system in accordance with some embodiments.

FIG. 2 shows an example of connected devices connected over a tethered system in accordance with some embodiments. In particular, FIG. 2 shows an exemplary structure of a device bank system including a device bank portal 22 where connected devices 80 with no data or Wi-Fi connection are tethered to an Internet capable device 90 using a USB cable, Wi-Fi tethering or any other means of tethering 95. The Internet capable device 90 is in turn connected to the device bank portal 22 over, for example, Wi-Fi, cellular or some other connections means 97. The connected devices 80 could belong to any operating system, software and firmware version. The connected device 80 might have a limitation of not being able to connect to any of the frequently used networks like Wi-Fi or mobile data. The connected devices 80 might also not have any short message system (SMS) or email capability which necessitates that the connected device 80 be connected to the device bank system via tethered methods.

Figure 3:
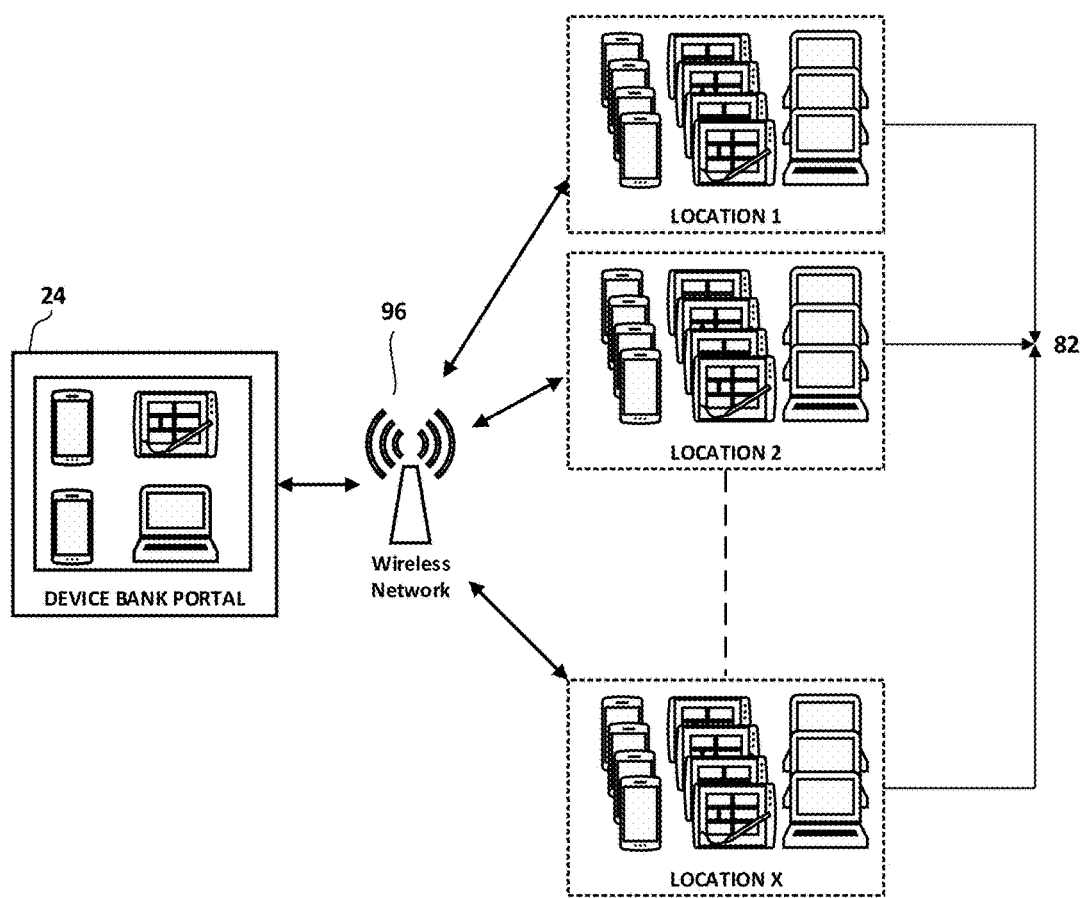
FIG. 3 shows an example of connected devices connected over a Wi-Fi system in accordance with some embodiments.

FIG. 3 shows an example of connected devices connected over a Wi-Fi system in accordance with some embodiments. In particular, FIG. 3 shows an exemplary structure of a device bank system including a device bank portal 24 with connected devices 82 connected to the device bank portal 24 over a Wi-Fi link 96. Since the connected devices 82 are connected to the device bank portal 24 over the Wi-Fi link 96, it empowers the device bank system to place these connected devices 82 in different locations to recreate the various network and environmental scenarios. Mobile equipment manufacturers often release devices with a lot of variations for different geographical areas based on the popularity and the network conditions available locally. The device bank system has the ability to provision all these different connected devices and make them available for remote connection.

Figure 4:
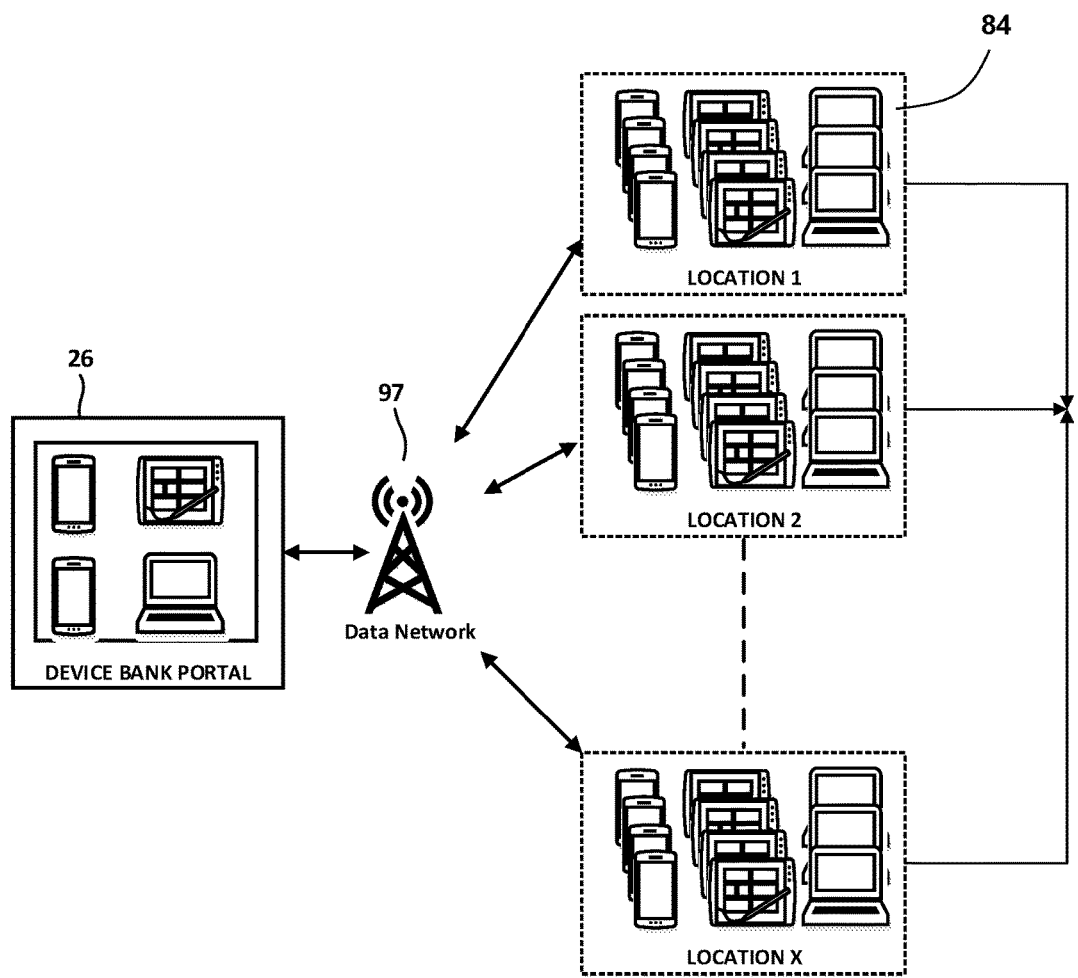
FIG. 4 shows an example of connected devices connected over a cellular network in accordance with some embodiments.

FIG. 4 shows an example of connected devices connected over a cellular network in accordance with some embodiments. In particular, FIG. 4 shows an exemplary structure of a device bank system including a device bank portal 26 with connected devices 84 connected to the device bank portal 26 over a cellular data network 97. The connected devices 84 in the device bank system can be placed in various geographical locations. The connected devices 84 could use the cellular data network 97 available in the different locations for the purpose of connecting to the device bank system. This allows programmers and testers to verify and validate their work on networks provided by various network providers, for example.

Referring back to FIG. 1, the admin server 40 is responsible for provisioning the connected devices into the device bank system 1, monitoring all the connected devices in the system 1 and keeping track of the connected devices that are online and ready for connection, creating emulator instances for devices that are not available in the device banks 30 and making remote connections to the devices enrolled in the system 1.

Figure 5:
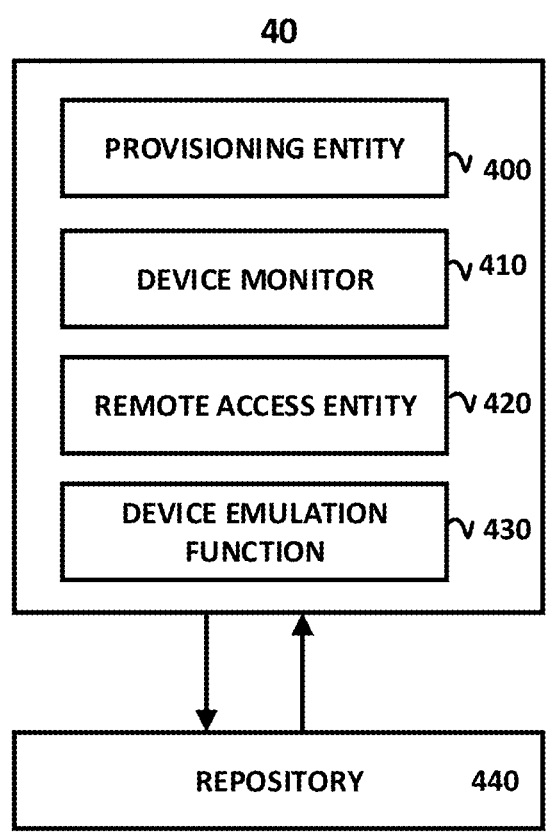
FIG. 5 shows an example of certain components of an administration server in accordance with some embodiments.

FIG. 5 shows an example of certain components of an administrator server 40 in accordance with some embodiments. The administrator server 40 consists of a provisioning entity 400, a device monitor 410, a remote access entity 420, a device emulation system 430 and a repository 440.

The provisioning entity 400 is responsible for registering and enrolling connected devices into the system 1. The connected devices are loaded with an intelligent client which can communicate with the provisioning entity 400 for the purpose of exchanging provisioning parameters and remote control access. Once the client is installed on the device, the device will exchange authentication information with the provisioning entity 400. Once the device is authenticated, the device client sends all device information, for example, but not limited to, make, model, software version, base band version and the like, back to the provisioning entity 400. The device is now registered into the system 1.

The device monitor 410 handles the tracking of the connected devices and verifying if the connected device is online or offline. The device client and the device monitor 410 will communicate with each other at specific intervals. The device monitor 410 sends a keep alive message to the device client at predetermined intervals of time. The device client responds back to the device monitor 410 to inform that the connected device is ready and available for connection.

The remote access entity 420 is responsible for device management, device connectivity, security management, analytics, web services, administrative services and data management. The remote access entity 420 includes a communication end point gateway (CEG), an admin and control function and an authentication function module. The gateways, modules and/or entities are implemented as or in processors, servers and/or any computing device or system.

The CEG manages the device connections within the system. In particular, the CEG provides communication endpoints between the admin and control function module or entity and the devices in the device bank 30, allows for multiple requests to be serviced within one session from multiple consoles, provides a consistent manner of device connection and tool service in a system with heterogeneous devices running different operating systems, and provides load balancing across multiple connection handlers on each CEG in order to minimize single point of failure. The CEG includes at least a connection monitor and connection handlers. The connection monitor creates and manages connection handlers, creates session IDs for new connection requests and monitors all the scheduled and existing sessions. By default, a connection handler is setup for every CEG, where the number of connection handlers is configurable. All the sessions are load distributed across the connection handlers. Each connection handler handles multiple device sessions.

The admin and control function or entity administers and manages all types of communication between the admin server and the client devices. For example, the admin and control function or entity may include an administrative service that acts as the central administration entity of the system. Through this service, system administrators perform administration, management and instrumentation of all the servers within the system. In another example, the admin and control function or entity may have a management service which provides the operational end point to the system and performs load distribution among the CEG, management of device registration, administration of devices and session queuing. A management entity may be included which is responsible for providing the management service with in-memory data storage for key operational data user/group/zone structures, and the like. In another example, the admin and control function or entity may have a service coordinator which is responsible for coordinating the communication between various elements within the system. It provides the database interface to the provisioning entity 400.

The device emulator or emulation function 430 is responsible for monitoring and managing the emulator machines, receiving requests from the administrator server for creating new emulator instances and forwarding the request out to the correct emulator machine. The device emulator function 430 is described in more detail herein below.

The repository 440 stores all the information about the connected devices in the device banks 30, server configurations, tasks and status settings. The repository 40, which may be implemented as databases as shown below, are pivotal to configure and update managed devices and server components. It is also responsible for maintaining the device authentication information. The repository 440 may comprise three database (DB) elements: an admin DB, operations (Ops) DB, and a reports DB. The admin DB maintains all the system configurations, device bank configuration and management information, system administration and server instrumentation data. The admin database is accessed by the administrative service. The Ops DB maintains data that is required for the operations of the system such as device enrollment, device profiles, tutorials and knowledge bases. The reports DB contain historical data of device enrollment, session, audit, report views, and the like.

Figure 6:
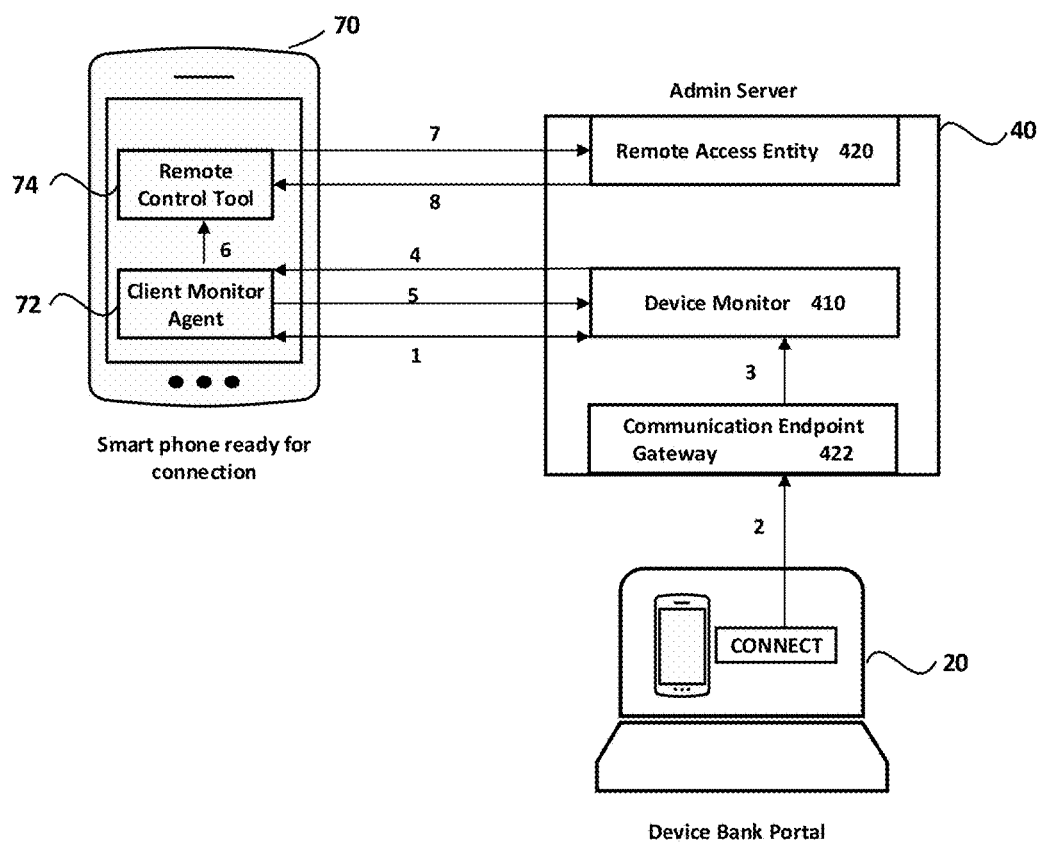
FIG. 6 shows an example control flow for remote connection initiation in accordance with some embodiments.

FIG. 6 shows an example control flow for remote connection initiation in accordance with some embodiments. In particular, FIG. 6 shows the call flow that takes place between a device bank portal 20, administrator server 40 and a connected device 70 within a device bank 30. The device monitor 410 within the administrator server 40 sends keep alive messages to a client monitor agent 72 on the connected device 70 at regular intervals of time to ensure that the connected device is online (1). The client monitor agent 72 responds back to the keep alive message by announcing that the connected device 70 is online and ready for connection. A remote user logs in to the device bank portal 20, chooses the required device and initiates a remote connection with the connected device 70. The device bank portal 20 sends this connection request over to the connection authorization function within a CEG 422, which is part of a remote access entity 420 in administrator server 40, for example (2). The CEG 422 transfers this request to the device monitor 410 to first verify if the connected device 70 is online (3). If the connected device 70 is online, the device monitor 410 sends a connection request payload to the client monitor agent 72 within the connected device 70 (4). The client monitor agent 72 processes this connection request payload and sends an acknowledgement back to the administrator server 40 (5). The device connection is now established. The client monitor agent 72 then determines which tool needs to be invoked. In this example, the remote control tool 74 is being invoked (6). Once the remote control tool 74 is active, it begins communication with a remote access entity 420 within the administrator server 40 (7 and 8). The remote control session is now established.

Figure 7:
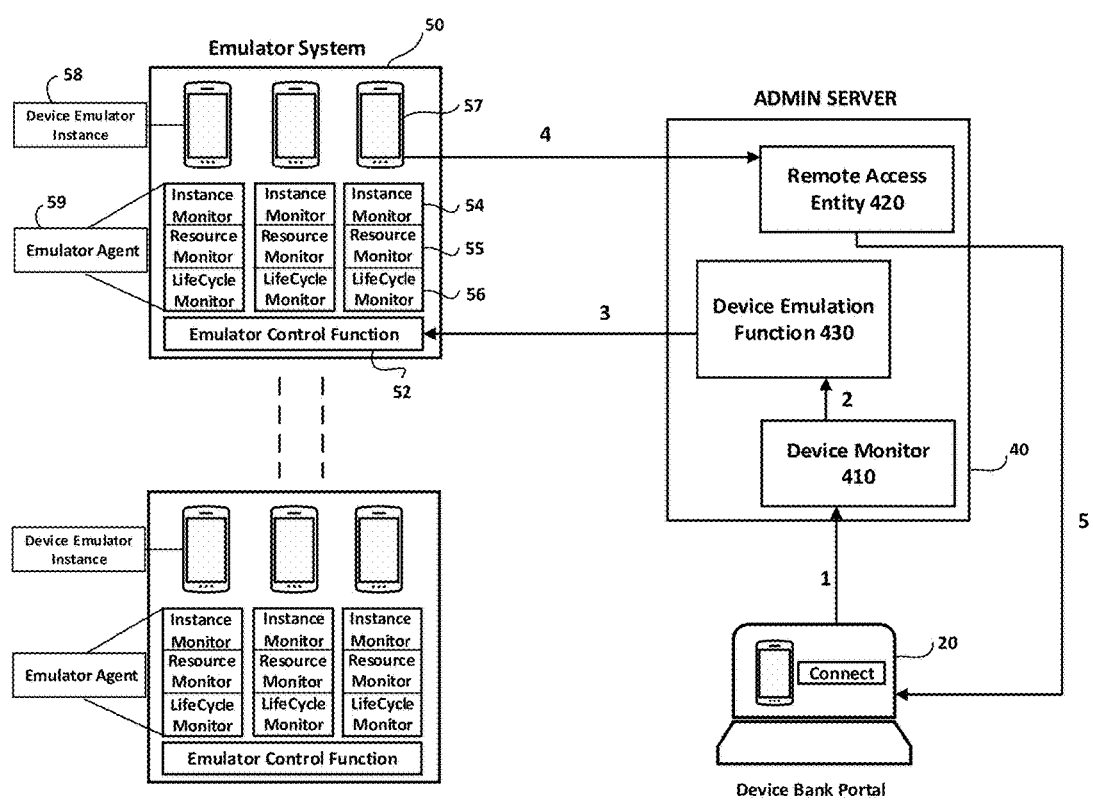
FIG. 7 shows an example control flow for remote connection to an emulator instance in accordance with some embodiments.

FIG. 7 shows an example control flow for remote connection to an emulator instance in accordance with some embodiments. In particular, FIG. 7 shows the call flow that takes place when a request is made to initiate a remote connection with an emulator instance of a connected device. A user sends a request to make a remote connection to a connected device on a device bank portal 20. This request is sent to a device monitor 410 of an administrator server 40 (1). The device monitor 410 examines all the provisioned devices to determine if the requested device is available for remote connection. If a physical device is not available for remote connection, the device monitor 410 will send a request to a device emulator function 430 to create an emulator instance of a device of required specifications (2). The device emulator function 430 is responsible for maintaining and monitoring one or more emulator systems 50. It is also responsible for allocating resources to the emulator system 50, load balancing, and managing the state of the emulator systems 50. The device emulator function 430 processes the incoming request and determines which emulator system 50 needs to be called to create an emulator instance. This may depend on the amount of load each emulator system 50 is handling and the availability of the required device images on the emulator systems 50. Once determined, a request is sent to the emulator system 50 to instantiate a new emulator instance (3).

The emulator system 50 comprises of an emulator control function 52, one or more instance monitors 54, one or more resource monitors 55, one or more lifecycle monitors 56 and virtual images 57 of all the devices. The emulator control function 52 is responsible for creating emulator instances 58 to the required specifications. The emulator control function 52 spawns a new device emulator agent 59 for each new instance of the device emulator created. The device emulator agent stack 59 comprises of an instance monitor which is responsible for creating a new instance of a device image when the request is received, and a resource monitor which is responsible for applying additional resources needed to the device images in order to reach the predetermined specifications. The resource monitor is also responsible for saving any configurations and modifications made on the emulator instances for future use. The device emulator agent stack 59 also includes a lifecycle monitor which is responsible for managing the different states in the life cycle of the emulator instances. The different states maybe Idle state, Setup state, Open state, and Cleanup state. The emulator instance, once created, begins communication with the remote access entity 420 (4). At this point, a remote connection is established between the emulator instance 58 and administrator server 40. This is then relayed back on the device bank portal 20 which displays the emulator instance on its user interface and allows the user to control and utilize the instance (5).

Described herein is a development use case using certain of the embodiments described herein. Today, many corporations are multinational and have programming done in many parts of the world. These programmers need constant access to a multitude of connected devices for development and testing. They might also require certain software, hardware and network conditions in place which might not be available locally. This would typically involve travelling to the location where the connected devices and the ideal network and software conditions are available or purchasing expensive connected devices and recreating the environment locally. This involves a lot of time, money and effort. The device bank system described herein alleviates some of these efforts by providing easy and remote access to all the hardware, software and network setup necessary. It also provides mobile software programmers with an effortless solution for integrating remote connected devices with other development environments to simplify the construction of new mobile applications and software. The system allows programmers to publish applications in object format to the remote connected devices and use a remote debugging bridge which allows debugging the connected device from the development machine.

Figure 8:
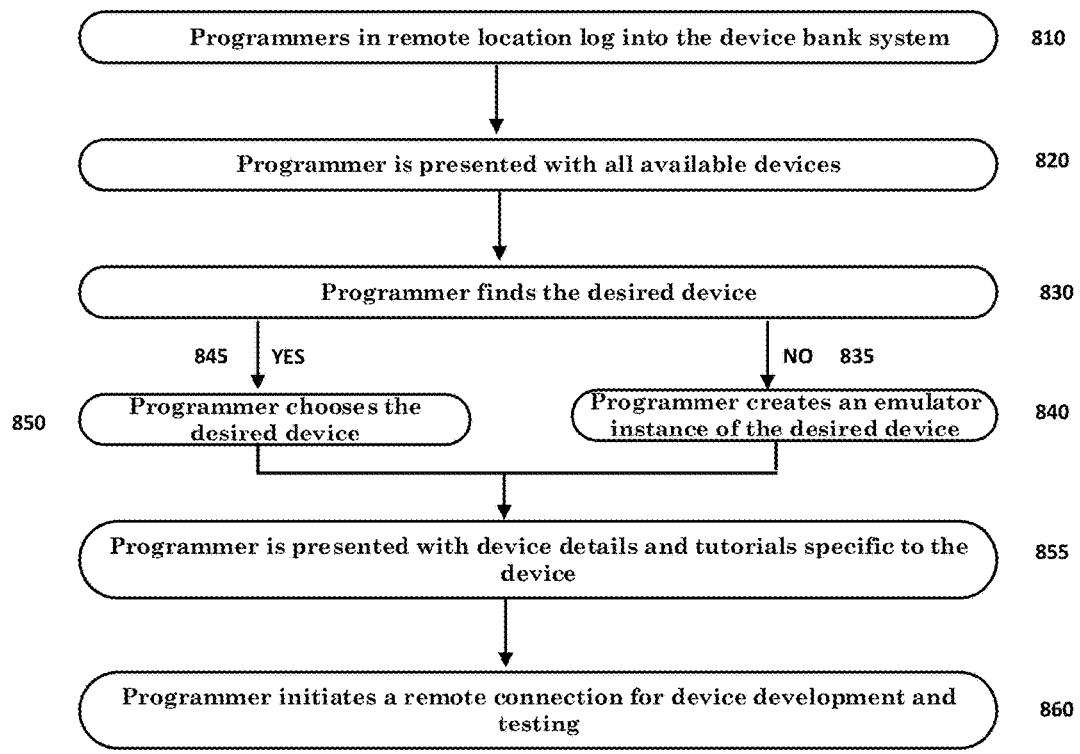
FIG. 8 shows an example flowchart for use of a remote management system for device simulation by a developer in accordance with some embodiments.

FIG. 8 shows an example flowchart for use of a remote management system for device simulation by a developer in accordance with some embodiments. Users or programmers in a remote location log into a device bank system (810). The user is presented with a list of all available provisioned connected devices on a console (820). The user determines if the required connected device is available (830). If the user cannot find the desired device (835), the user is presented with the option to create an instance of the emulator for the desired device configurations (840). The user is presented with a view of the external structure of the device, a summary of all the hardware related features and all the basic information of the device such as make, model, OS version, software version, IMEI, MDN, Baseband version, kernel version and the like (855). User then initiates a remote connection to the emulator instance and can then remotely connect and control the emulator instance to perform any action on it as if it were a physical device. This includes key injections, gestures, install and uninstall of applications, network manipulations and the like (860).

If the desired device is available for remote connection (845), the user can select this device by clicking on its image on the console (850). This presents the user with a view of the external structure of the device, a summary of all the hardware related features and all the basic information of the device such as make, model, OS version, software version, IMEI, MDN, Baseband version, kernel version and on the like (855). The user is also presented with appropriate means like a button to start a remote connection with the device (860). Once the user initiates a remote control session, the user can perform any action on the device. This includes key injections, gestures, install and uninstall of applications, network manipulation and so on.

Described herein is a training use case using certain of the embodiments described herein. Remote support technicians accept calls from end users about connected device issues all the time. This requires the technician to be proficient and comfortable with the layout and features of the connected devices. This also involves having extensive knowledge on configuring the different applications and features of the connected device. This necessitates training the remote support technicians on all the characteristics and features of the connected devices. This requires an enormous investment of time and money to gather all the connected devices and recreate the network domain. The device bank system described herein alleviates some of the time and effort necessary for gathering the connected devices and making it available on demand.

Figure 9:
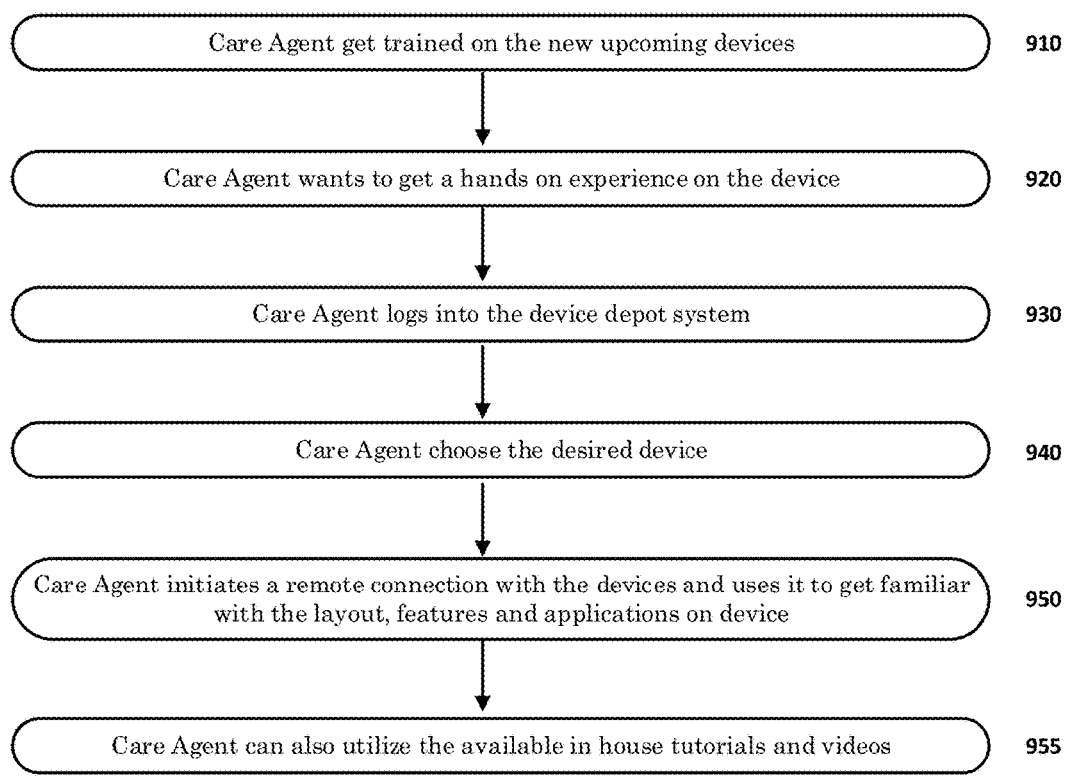
FIG. 9 shows an example flowchart for use of a remote management system for device simulation in a training scenario in accordance with some embodiments.

FIG. 9 shows an example flowchart for use of a remote management system for device simulation in a training scenario in accordance with some embodiments. A remote support technician wants to train himself (910) and get hands on experience on a connected device (920). The remote support technician logs into the device bank system (930). The technician chooses the desired device from the list of available and provisioned devices (940). The technician initiates a remote connection with the devices and uses it to get familiar with the layout, features and applications on device (950). The technician can also utilize the available in house tutorials and videos on the connected devices features to get more in depth knowledge (960). This empowers remote support technicians with the ability to understand the end user's needs by giving them the confidence and resources that they need to deal with end users effectively.

Described herein is an end user assist use case using certain of the embodiments described herein. Remote support technician gets on a call with an end user who needs configurations to be changed on a connected device either to fix an issue on the connected device or to improve its performance. The configuration changes might have major impact on the connected device if not done accurately. It would be beneficial for the remote support technician to have easy access to test devices of the exact make, model and software version which they can utilize and experiment on. This allows them to analyze the impact of the changes made prior to altering the end user's connected device. The device bank system described herein provides an easy solution to this situation by allowing for easy integration with the remote support technician's remote control system.

The device bank system can be deployed as a link or button on the remote support technician console.

Figure 10:
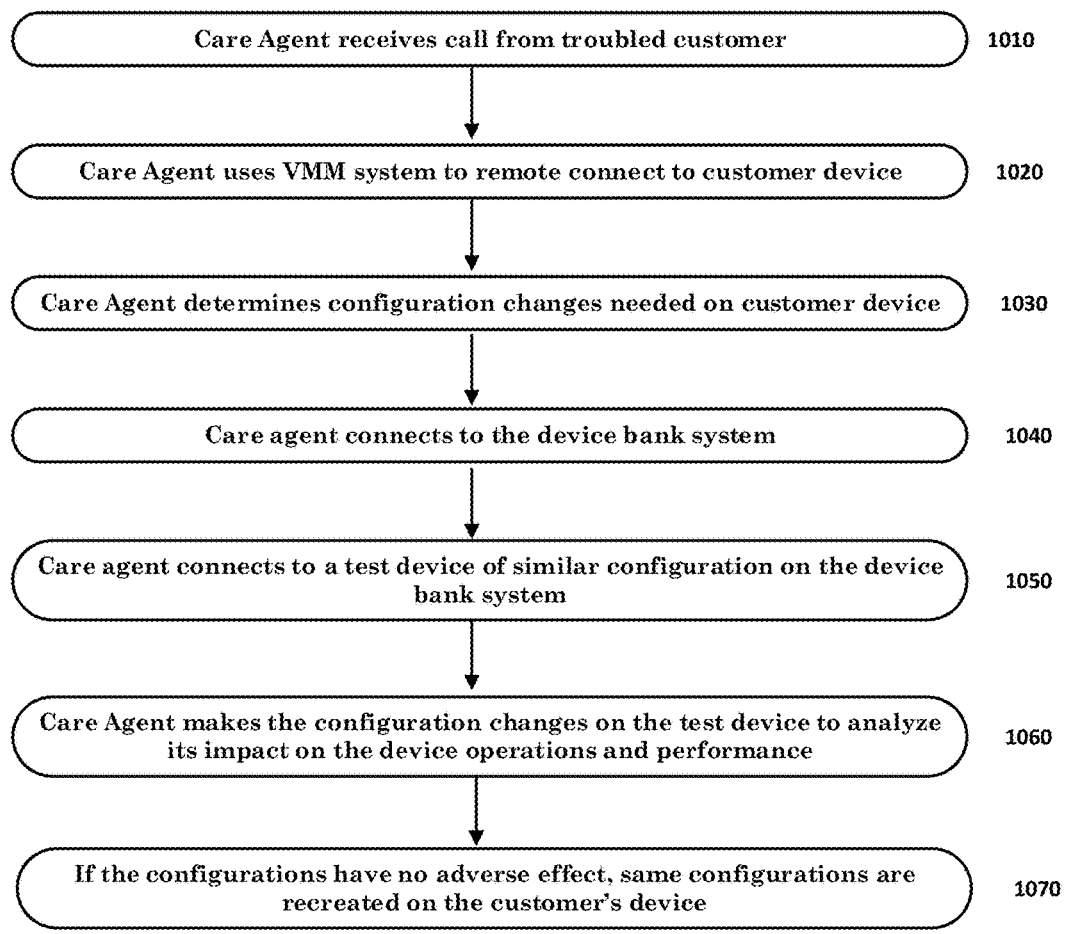
FIG. 10 shows an example flowchart for use of a remote management system for device simulation in an end user assist scenario in accordance with some embodiments.

FIG. 10 shows an example flowchart for use of a remote management system for device simulation in an end user assist scenario in accordance with some embodiments. A remote support technician receives a call from the end user with issues on a connected device (1010). The remote support technician uses the virtual mobile management system to remotely connect to the end user's device and analyze the problem encountered (1020). The technician determines that certain configuration changes are necessary, but does not know the impact of the changes on the overall performance of the connected device (1030). The technician clicks on a button or link on the remote control screen which sends a request to the device bank system (1040). This request contains information about the connected device that is currently being remotely controlled. The device bank system receives the request and pulls out a test device with the exact make, model and software version. This is displayed to the technician on the remote control screen. The remote support technician can initiate a connection to the test device (1050) and try out the necessary configurations on the test device (1060). The remote support technician can also analyze the impact of the configurations on the device functioning and performance. If the configurations have no adverse effect, the technician can execute the same configurations on the end user's device (1070).

Described herein is another end user assist use case using certain of the embodiments described herein. Remote support technicians receive calls from end users on complicated issues which require time to trouble shoot and find resolutions. Either the remote support technician can trouble shoot the issue on the end users device, wasting the end users valuable time or try to replicate the issue and find a resolution on a test device of the same make, model and software version. Acquiring test devices of the exact make, model and software version on demand can be a challenge. The device bank system described herein makes this task easier by providing effortless online access to almost every connected device necessary.

Figure 11:
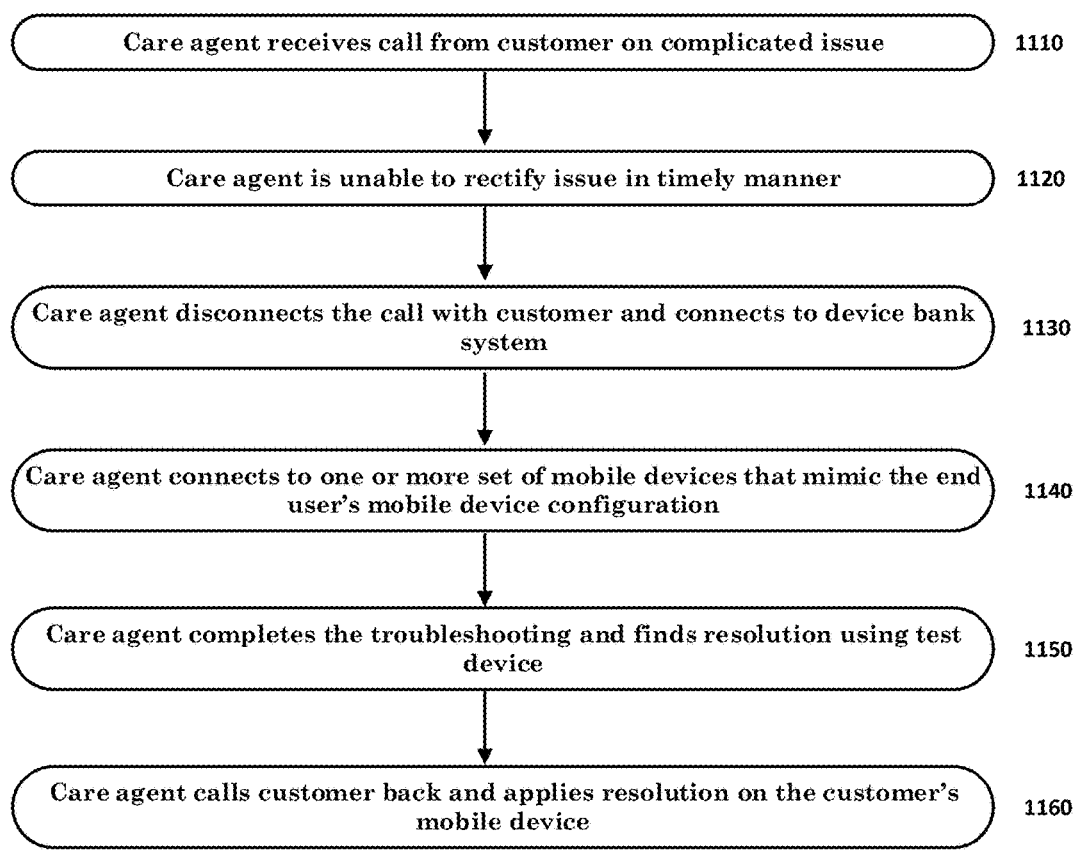
FIG. 11 shows an example flowchart for use of a remote management system for device simulation in another end user assist scenario in accordance with some embodiments.

FIG. 11 shows an example flowchart for use of a remote management system for device simulation in another end user assist scenario in accordance with some embodiments. A remote support technician receives a call from the end user on a complicated issue (1110). The remote support technician attempts to rectify the issue but is unable to resolve it in a timely manner (1120). The remote support technician disconnects the call with the end user and connects to the device bank system (1130). The technician connects to one or more set of connected devices that mimic the end user's connected device configuration in order to troubleshoot (1140). This may include transmitting a media stream over a network based on the configuration of the communication component, receiving the media stream over the network and mimicking the end user's wireless environment. Once the remote support technician completes the troubleshooting process and finds a resolution to the issue on the test device (1150), the technician can call the end user back again and apply the resolution on the end user's connected device (1160).

In general, a method for performing device simulation includes logging onto a device bank portal in accordance with an event, selecting a connected device from a plurality of connected devices in a device bank on a condition that the connected device is available in the device bank, establishing a connection with the connected device and requesting activities on the connected device in accordance with the event to simulate end user device performance. The method further includes initiating creation of an emulator instance of the connected device on a condition that the connected device is unavailable. In an embodiment, the connection is with the emulator instance of the connected device. In an embodiment, the details and tutorials specific to the connected device are presented to the end user. In an embodiment, the event and the activities are for connected device development and testing. In an embodiment, the activities are for end user training on the connected device.

In an embodiment, the event is a call from an end user for assistance with end user device, which includes establishing a remote management session with the end user device, determining that configuration changes are needed on the end user device, configuring the connected device with the configuration changes to analyze impact of the configuration changes on operations and performance of the connected device and configuring the end user device on a condition that the configuration changes have no adverse effect on the connected device.

In an embodiment, the event is a call from an end user to resolve an issue with end user device, which includes establishing a remote management session with the end user device, disconnecting the remote management session on a condition that time needed to resolve the issue exceeds a predetermined threshold, wherein the activities include trouble shooting on the connected device to determine a solution and contacting the end user to apply the solution to the end user device.

In general, a device bank system includes at least one device bank configured to hold a plurality of connected devices, and a device bank portal configured to present a list of the plurality of connected devices to a user. The device bank portal is configured to receive a request from a user to connect to a connected device. The administrator server is configured to locate the connected device from the at least one device bank on a condition that the connected device is available and to establish a connection with the connected device. The device bank portal, the administrator server and the connected device are configured to perform activities requested by the user to simulate end user device performance. In an embodiment, the details and tutorials specific to the connected device are presented to the user prior to establishing a connection with the connected device. In an embodiment, the plurality of connected devices in the at least one device bank are connected to the device bank portal via at least one of a cellular connection, a tethered connection, and a Wi-Fi connection. In an embodiment, the tethered connection is via an Internet capable device. In an embodiment, the administrator server further includes a provisioning entity configured to register and enroll connected devices into the device bank system, a device monitor configured to track the connected devices and verify online/ offline status of the connected devices, a remote access entity configured to at least establish connectivity to the connected devices, a device emulator entity configured to at least create, monitor and manage emulator machines and emulator instances and a repository configured to store information regarding at least the connected devices. The system further includes the device bank portal and the administrator server configured to permit the end user to create an emulator instance of the connected device on a condition that the connected device is unavailable. In an embodiment, the administrator server further comprises a device monitor configured to determine availability of a requested connected device and a device emulator entity configured to create an emulator instance in response to a request from the device monitor.

In general, a method for performing device simulation includes presenting a list of a plurality of connected devices in response to an end user logging onto a device bank portal, receiving a request from the end user to connect to a connected device, locating the connected device from the at least one device bank on a condition that the connected device is available, establishing a connection with the connected device and performing activities on the connected device in accordance with end user requests to simulate end user device performance. In an embodiment, the method further includes creating an emulation instance on a condition that the connected device is unavailable. In an embodiment, the method further includes presenting details and tutorials specific to the connected device prior to establishment of the connection. In an embodiment, the plurality of connected devices are connected to the device bank portal via at least one of a cellular connection, a tethered connection, and a Wi-Fi connection. In an embodiment, the tethered connection is via an Internet capable device.

While detailed embodiments of the instant invention are disclosed herein, it is to be understood that the disclosed embodiments are merely exemplary of the invention, which may be embodied in various forms. Therefore, specific functional and structural details disclosed herein are not to be interpreted as limiting, but merely as a basis for the claims and as a representation basis for teaching one skilled in the technology to variously employ the present invention in virtually any appropriately detailed structure.

Although features and elements are described above in particular combinations, each feature or element can be used alone without the other features and elements or in various combinations with or without other features and elements.

What is claimed is:

1. A method for providing an array of physical devices and emulation devices to improve performance of a remote end user device, the method comprising:
receiving, by a device bank portal, a request from the remote end user device in accordance with an event, wherein the device bank portal is communicatively coupled to an administrative server, a plurality of emulation devices and a plurality of physical devices;
identifying, by the device bank portal, a set of configuration parameters for the remote end user device based on the request, wherein the set of configuration parameters includes at least one of a make, model, software version and base band version of the remote end user device;
determining, by the administrative server, if a physical device is available from the plurality of physical devices that matches the set of configuration parameters of the remote end user device;
configuring, by the administrative server, a particular emulation device from the plurality of emulation devices for the remote end user device based on unavailability of the physical device, wherein the configuring sets parameters of the particular emulation device to emulate the set of configuration parameters of the remote end user device;
executing, by the particular emulation device, activities in accordance with the request for the event to emulate performance of the remote end user device;
receiving, by the administrative server, performance results from the particular emulation device based on the executing; and provisioning the remote end user device based on the performance results to improve the performance of the remote end user device.

2. The method of claim 1, further comprising:
initiating creation of an emulator instance of the remote end user device on a condition that the physical device is unavailable.

3. The method of claim 1, wherein details and tutorials specific to the remote end user device are presented to an end user.

4. The method of claim 1, wherein the event and the activities are for connected device development and testing.

5. The method of claim 1, wherein the event and the activities are for end user training on the remote end user device.

6. The method of claim 1, further comprising:
determining that configuration changes are needed on the remote end user device; and
configuring the particular emulation device with the configuration changes to analyze impact of the configuration changes on operations and performance of the remote end user device, wherein the particular emulation device is used for emulating the configurations changes prior to implementing on the remote end user device.

7. A system providing an array of physical devices and emulation devices to improve performance of a remote end user device, comprising:
a plurality of emulation devices that are communicatively coupled to a device bank portal;
a plurality of physical devices that are communicatively coupled to the device bank portal;
an administrator server that is communicatively coupled to the plurality of physical devices, the plurality of emulation devices and the device bank portal;
wherein a processor of the administrator server:
receives, via the device portal, a request for an event from the remote end user device,
identifies, using the bank portal, a set of configuration parameters for the remote user device based on the request, wherein the set of configuration parameters includes at least one of a make, model, software version and base band version of the remote end user connected device;
determines if a physical device is available from the plurality of physical devices that matches the set of configuration parameters of the remote end user device;
configures a particular emulation device from the plurality of emulation devices for the remote end user device based on unavailability of the physical device, wherein the processor of the administrator server sets parameters of the particular emulation device to simulate the set of configuration parameters of the remote end user device,
causes the particular emulation device to execute activities in accordance with the request to emulate performance of the remote end user device,
receives, from the particular emulation device, performance results based on the particular device executing the activities, and
provisions the remote end user device based on the performance results to improve the performance of the remote end user device.

8. The system of claim 7, wherein the administrator server presents details and tutorials specific to the remote end user device are presented to the user prior to establishing a connection with the emulation machine.

9. The system of claim 7, wherein the plurality of physical devices are connected to the device bank portal via at least one of a cellular connection, a tethered connection, and a Wi-Fi connection.

10. The system of claim 9, wherein the tethered connection is via an Internet ready device.

11. The system of claim 7, wherein the processor of the administrator server further:
registers and enrolls connected devices as a physical device or emulation device into the system;
tracks each of the plurality of physical devices and emulation devices and verifies online/offline status of each of the plurality of physical devices and emulation devices; and
stores, in a repository of the administrator server, information regarding at least the plurality of physical devices and emulation devices.

12. The system of claim 7, the processor of the administrator server further:
creates an emulator instance of the connected device on a condition that physical connected device is unavailable.

13. The system of claim 7, wherein the processor of the administrator server further:
determines availability of the physical connected device; and
creates an emulator instance in upon unavailability of the physical connected device.

14. A method for performing device emulation, the method comprising:
presenting a list of a plurality of connected devices in response to an end user logging onto a device bank portal, wherein the plurality of connected devices are provided as emulation devices and physical devices;
receiving, at a device bank system, a request from the end user to connect to a connected device;
locating, by the device bank system, the connected device from at least one device bank on a condition that the connected device is available;
configuring the device bank system to interact with a user to use an emulation device for the connected device based on unavailability of a physical device for the connected device;
establishing a connection with the emulation device;
performing activities on the emulation device in accordance with end user requests to emulate performance of the unavailable physical device of the end user device; and
configuring the end user device based on the performance results from running the activities in accordance with the event.

15. The method of claim 14, further comprising:
creating an emulation instance on a condition that the physical device is unavailable.

16. The method of claim 14, further comprising:
presenting details and tutorials specific to the connected device prior to establishment of the connection.

17. The method of claim 14, wherein the plurality of connected devices are connected to the device bank portal via at least one of a cellular connection, a tethered connection, and a Wi-Fi connection.

18. The method of claim 17, wherein the tethered connection is via an Internet ready device.

* * * * *